United States Patent [19]
Schroeder

[11] Patent Number: 5,378,093
[45] Date of Patent: Jan. 3, 1995

[54] DUNNAGE BAR LOCK

[76] Inventor: Robert C. Schroeder, 7435 Gills Pier Rd., Northport, Mich. 49670

[21] Appl. No.: 27,226

[22] Filed: Mar. 5, 1993

[51] Int. Cl.⁶ ........................... B61D 45/00; B60P 7/15
[52] U.S. Cl. ...................................... 410/32; 410/144; 410/43; 211/41
[58] Field of Search ............. 410/32, 34, 43, 143–149, 410/152; 211/41; 94.5; 108/55.1; 206/449, 451

[56] References Cited

U.S. PATENT DOCUMENTS

| | | | |
|---|---|---|---|
| 1,405,757 | 2/1922 | Clark | 410/32 |
| 2,806,436 | 9/1957 | Johnston | 105/369 |
| 2,900,925 | 8/1959 | Dunlap | 105/369 |
| 3,051,099 | 8/1960 | Roberston | 105/369 |
| 3,078,813 | 2/1963 | Rolfe, Jr. | 105/369 |
| 3,090,329 | 5/1963 | Rolfe, Jr. | 410/148 |
| 3,229,994 | 1/1966 | Klein | 280/179 |
| 3,411,459 | 11/1968 | Hyatt | 105/369 |
| 3,431,015 | 3/1969 | Breen et al. | 296/24 |
| 3,486,468 | 12/1969 | Bezlaj et al. | 105/376 |
| 3,554,136 | 1/1971 | Falk et al. | 105/369 |
| 3,774,939 | 11/1973 | Freads et al. | 280/179 |
| 3,799,070 | 3/1974 | Munson | 105/369 |
| 3,830,537 | 8/1974 | Brindle | 292/259 |
| 4,074,634 | 2/1978 | Snow et al. | 105/493 |
| 4,079,677 | 3/1978 | Vandergriff | 105/501 |
| 4,091,745 | 5/1978 | Patch | 410/146 |
| 4,256,425 | 3/1981 | Burgess et al. | 410/149 |
| 4,553,888 | 11/1985 | Crissy et al. | 410/144 |
| 4,915,428 | 4/1990 | Hayakawa | 292/29 |
| 4,919,277 | 4/1990 | Jeruzal | 410/43 |
| 5,037,256 | 8/1991 | Schroeder | 410/243 |

FOREIGN PATENT DOCUMENTS 2460409 7/1976 Germany .............................. 410/32

OTHER PUBLICATIONS

Photographs submitted by applicant of previously marketed Dunnage Bar Assembly (filed and cited in Schroeder U.S. Pat. No. 5,037,256).

Primary Examiner—Michael S. Huppert
Assistant Examiner—Stephen Gordon
Attorney, Agent, or Firm—Barnes, Kisselle, Raisch, Choate, Whittemore & Hulbert

[57] ABSTRACT

A bar lock arrangement that includes a bar of rectangular cross section, a bar lock received on an end of the bar for releasably latching the bar to a frame in a position to secure freight, and a swing arm attached to the bar lock and pivotally mounted to the frame for enabling the bar to be moved from the latched position to a remote position for loading or unloading freight while keeping the bar captive to the frame. The bar lock has a spring-biased latch bolt and a locator pin projecting outwardly of the bar for receipt by a striker plate positioned on the frame opposite the end of the bar when the bar is in the latched position. The striker plate has an aperture for receiving the latch bolt to latch the bar and a slot for receiving the locator pin to guide the latch bolt into the aperture. A cable is attached to the latch bolt to retract the bolt from the aperture to unlatch the bar. The swing arm is secured on a pivot cantilevered from a mounting bracket affixed to the frame to permit the bar to be moved about an axis of the pivot.

27 Claims, 2 Drawing Sheets

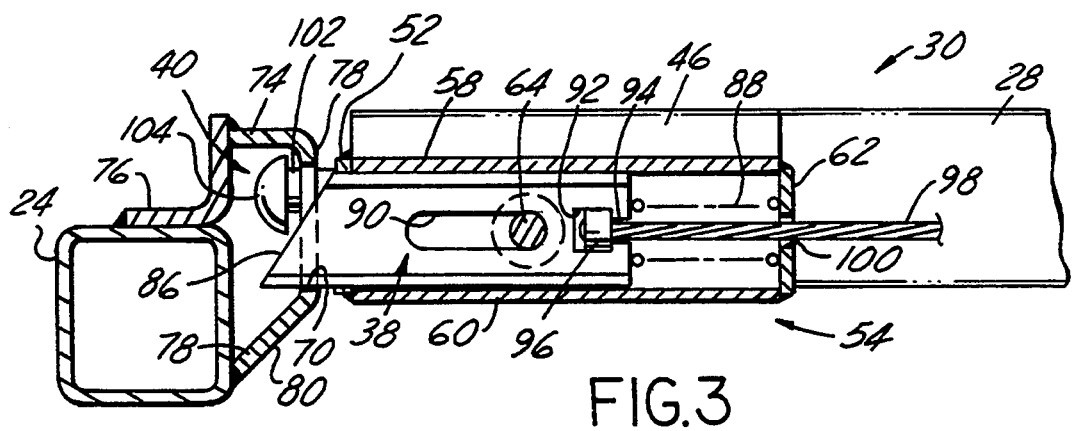
FIG.3
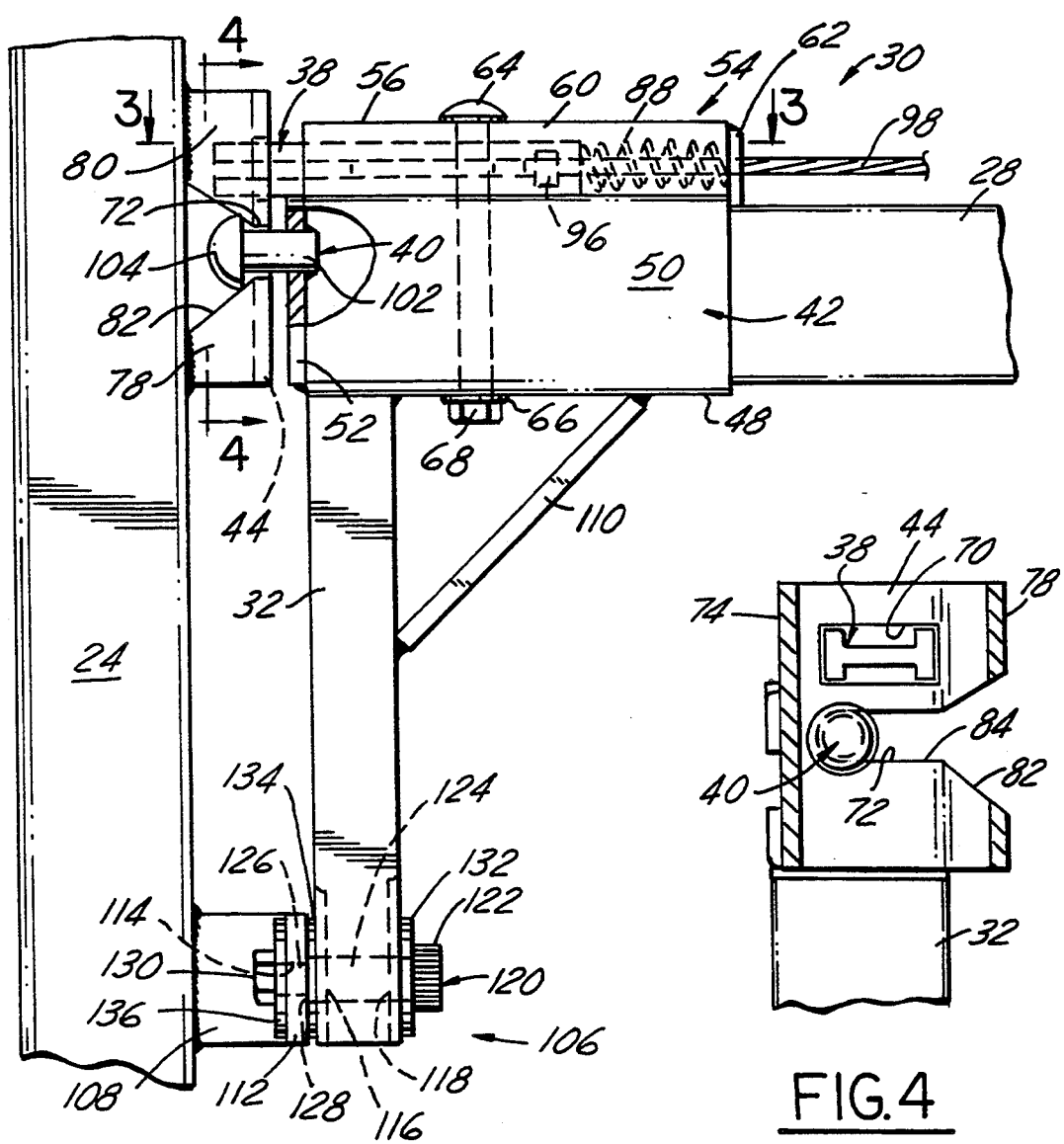
FIG.2
FIG.4

DUNNAGE BAR LOCK

The present invention is directed to bar lock arrangements, and more particularly to bar positioning and lock arrangements having particular utility in dunnage and like applications.

BACKGROUND AND OBJECTS OF THE INVENTION

A wide variety of lock arrangements have been used for securing bars to a frame in a fixed position to support and retain lading carried by the frame during transport. These bars, commonly known as dunnage bars, are releasably secured at each end in the fixed position by locking devices that typically permit each bar to be completely disengaged from the frame and removed to unload the cargo.

In one such commercially successful dunnage bar locking arrangement heretofore marketed by applicant, the lock includes a saddle having a base and parallel sidewalls spaced from each other by a distance to receive and laterally capture an end of the dunnage bar. A latch is mounted on an end wall of the saddle at a position spaced from the saddle base, and is rotatable on the end wall about an axis parallel to the saddle base between a lower position at which the latch captures the dunnage bar end against the saddle base between the sidewalls, and an upper position that permits removal of the dunnage bar end. A coil spring urges the latch against the saddle end wall and cooperates with a detent integral with an end wall for preventing rotation of the latch from the lower position to the upper position unless the latch is manually biased against the spring force. A cam surface on the detent automatically moves the latch against the spring force as the latch is manually pivoted from the upper to the lower bar-locking position.

Another such dunnage bar lock arrangement of applicant is that described in U.S. Pat. No. 5,037,256, which discloses a bar of rectangular cross section having a lateral opening in one side of the bar adjacent to the end of the bar, and a saddle that has a base and parallel sidewalls spaced from each other to receive the bar end on the saddle base between the sidewalls. Positioned beneath the saddle base is an L-shaped latch which has a leg that extends upwardly from the saddle base adjacent to the sidewalls, and a finger overlying and spaced from the saddle base by a distance corresponding to the cross sectional dimension of the bar end. The latch is pivotally mounted to the saddle beneath the saddle base, and a coil spring is captured between the saddle and latch bases for urging the latch finger to the position overlying the saddle base. The bar end engages a camming surface on the latch finger for pivoting the latch with respect to the saddle against the force of the spring so that the bar end is received within the saddle, with a locating pin on the saddle base received within the opening at the bar end. In this position, the bar end is thus locked beneath the latch finger and between the saddle sidewalls.

Although both of applicant's prior art lock arrangements described above have enjoyed substantial commercial acceptance and success, improvements nonetheless remain desirable. For example, before loading or unloading freight, these prior art locks must be completely disengaged and the bar removed from the frame, possibly resulting in expensive loss or theft of the detached bar and associated locking hardware. It is therefore a general object of the present invention to provide a dunnage bar locking arrangement that prevents the bar from being completely detached from the frame, even during cargo loading and unloading, thereby virtually eliminating loss or theft of the bar and locking hardware. It is also an object of the present invention to provide a locking arrangement that keeps the bar captive to the frame while enabling the bar to be moved relative to the frame between a releasably latched position for securing freight for shipment, and a position displaced from the latched position that provides sufficient clearance between the bar and the freight for loading or unloading freight. Another object of the present invention is to provide a bar lock arrangement in which the bar may be latched or unlatched without requiring operator manipulation of the locking device itself. Yet another object of the invention is to provide a lock arrangement that may be used with dunnage bars of the same or similar construction as those utilized with applicant's prior art locking arrangements, reducing the cost of changeover from either of applicant's existing lock arrangements to that of the present invention. A further object of the invention is to provide a bar lock arrangement that is less expensive to manufacture than are similar prior art locks, including both of applicant's prior art arrangements.

BRIEF DESCRIPTION OF THE DRAWINGS

The present invention, together with additional objects, features and advantages thereof, will be best understood from the following description, the appended claims and the accompanying drawings in which:

FIG. 2 is a fragmentary side elevational view of a dunnage bar and lock in the frame of FIG. 1.

FIG. 3 is a fragmentary sectional view taken substantially along line 3—3 of FIG. 2.

FIG. 4 is a fragmentary sectional view taken substantially along line 4—4 of FIG. 2.

DETAILED DESCRIPTION OF THE PREFERRED EMBODIMENT

Figure 1:
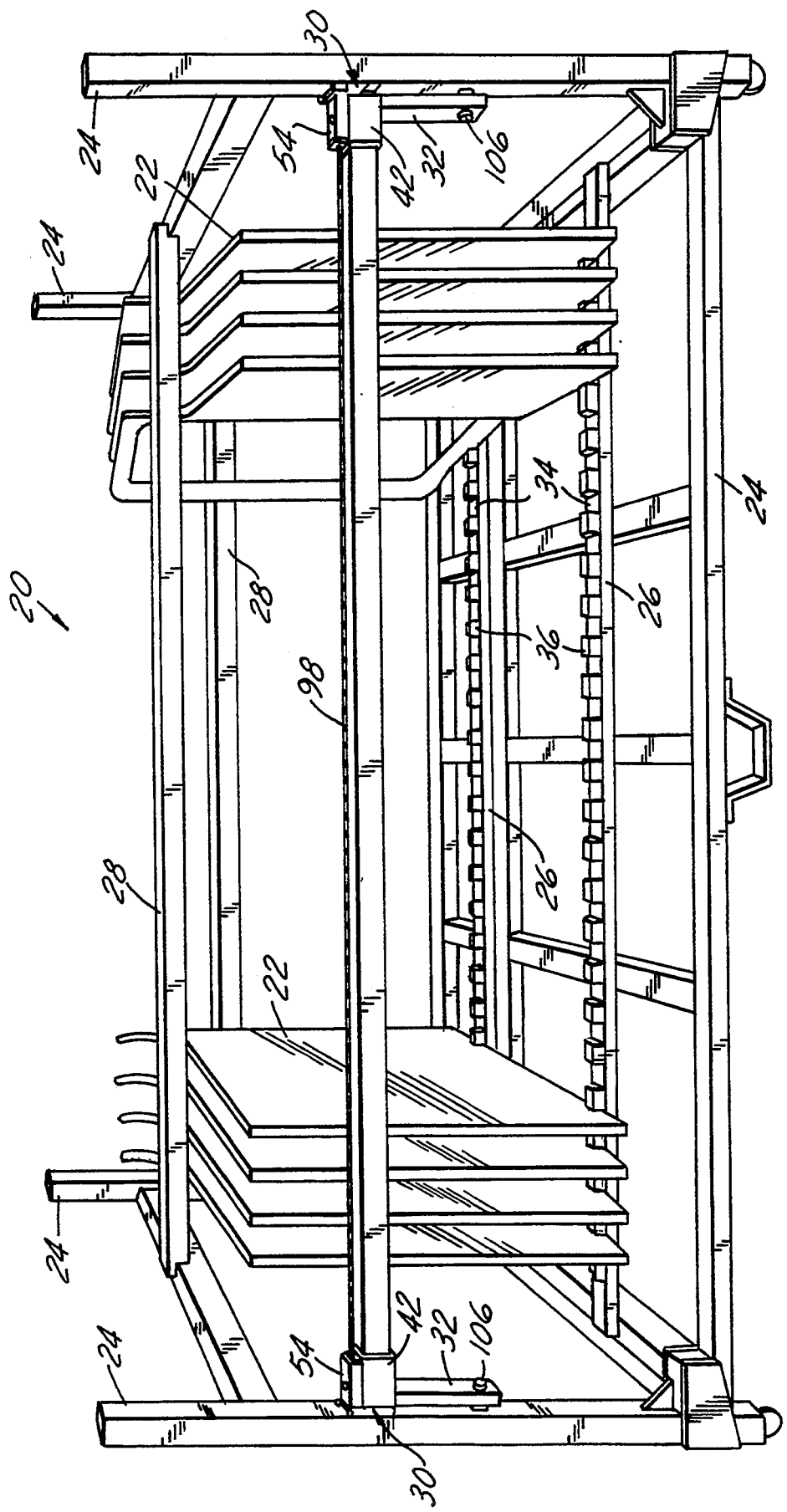
FIG. 1 is an elevational view of a shipping frame for automotive door panels featuring a dunnage bar and bar locks in accordance with the presently preferred embodiment of the invention.

FIG. 1 illustrates an assembly 20 for shipping automotive door panels 22 including a generally rectangular frame 24 with a bed 26 for receiving panels 22, and dunnage bars 28 spaced apart to secure panels 22 during shipment. The forward-most bar 28 has a bar lock 30 at each end for releasably latching bar 28 in the position shown in FIG. 1 to support and retain panels 22. Each bar lock 30 is pivotally mounted to frame 24 by a swing arm 32 for enabling bar 28 to be moved from the latched panel-retaining position (FIG. 1) to a position disposed from the latched position to permit panels 22 to be removed from or loaded on bed 26.

Bed 26 has individual slots 34 between segments 36 for receiving and holding the bottom edges of panels 22 at positions spaced from each other. To accommodate panels of different sizes or other parts of varying geometries, bed 26 may be adjustably mounted on frame 24. Dunnage bars 28 engage the top and side edges of door panels 22 to keep panels 22 spaced from each other while holding panels 22 against bed 26. Each bar 28 may be constructed of extruded aluminum stock or the like, having a rectangular, preferably square cross sectional contour and opposed ends received in associated bar locks 30.

The present invention is directed to the bar locking arrangement that includes bar locks 30 for releasably latching dunnage bar 28 to frame 24 in a position to secure panels 22 for shipment, and swing arms 32 pivotally mounting bar 28 to frame 24 to keep bar 28 captive on frame 24 while permitting relative motion therebetween. In this respect, it will be appreciated that the specific geometries of panels 22 and frame 24 shown in FIG. 1 are for purposes of illustration only.

Referring now to FIGS. 2–4, each bar lock 30 comprises a latch bolt 38 and a locator pin 40 on a sleeve 42 that is fixedly mounted to an end of dunnage bar 28. Bolt 38 and pin 40 engage a striker plate 44 positioned on frame 24 releasably to latch bar 28 in the panel-securing position (FIG. 1) to support and retain door panels 22 during transport. Sleeve 42 has a top wall 46 opposed and parallel to a bottom wall 48, which are spaced from each other by a front wall 50 defining a cavity complimentary to the cross sectional contour of bar 28 for being received over bar 28. Walls 46, 48 and 50 are interconnected by an end wall 52 adjacent to and overlying the end of bar 28. Attached to top wall 46 of sleeve 42 is a generally U-shaped guideway 54 having a top wall 56 and opposed downwardly projecting parallel sidewalls 58, 60 joined at one end by a back wall 62 for slidably telescopically receiving latch bolt 38 to control its line of motion during operation. A carriage bolt 64 passes through guideway 54, bar 28 and sleeve 42, and receives a washer 66 and a nut 68 to mount guideway 54 and sleeve 42 to bar 28.

A striker plate 44 is positioned on frame 24, as is more clearly depicted in FIG. 1, opposite each end of bar 28 when bar 28 is in position to secure panels 22 for shipment. Striker plate 44 has an aperture 70 for receiving latch bolt 38 releasably to latch bar 28 in the panel-securing position, and a slot 72 for receiving locator pin 40 to guide bolt 38 into aperture 70. To accommodate receipt of bolt 38 and pin 40, plate 44 is spaced from frame 24 by a rear wall 74 attached along one edge to an angle bracket 76 affixed to frame 24, and a front wall 78 attached along one edge directly to frame 24. Front wall 78 is angled (FIG. 3) to provide a sloped camming surface 80 for urging latch bolt 38 into guideway 54 to clear plate 44, so that bolt 38 may be received in aperture 70. Slot 72 has an outwardly flared mouth 82 to facilitate entry of locator pin 40 and a narrow portion 84 for engaging pin 40 more accurately to guide latch bolt 38 into aperture 70.

As is illustrated in FIGS. 3–4, latch bolt 38 is of generally I-shaped cross sectional contour and has an angled surface 86 at its outwardly projecting free end for camming along striker front wall 78 to retract bolt 38 for latching. When in the latched position, bolt 38 is received in aperture 70 and can abut against striker plate 44 to prevent bar 28 from pivoting downwardly away from the top edges of panels 22. A coil spring 88 is captured in compression between the opposite end of bolt 38 and back wall 62 of guideway 54 for resiliently urging bolt 38 outwardly from guideway 54. To limit relative movement between latch bolt 38 and guideway 54, carriage bolt 64 extends downwardly through a centrally located slot 90 in latch bolt 38 (FIG. 3). Slot 90 is of sufficient length to limit projection of bolt 38 outwardly from guideway 54, while allowing bolt 38 to be withdrawn completely into guideway 54 to permit the latching and unlatching of bar 28. Adjacent to slot 90 is a generally square opening 92 that communicates with a channel 94 extending to the end of bolt 38 for receiving a ferrule 96 attached to one end of a cable 98. Cable 98 extends through channel 94, spring 88 and an opening 100 in back wall 62 of guideway 54 to permit bolt 38 to be manually retracted from aperture 70 to unlatch bar 28. Preferably, both latch bolts 38 on dunnage bar 28 are joined to each other by cable 98 to enable both latch bolts to be retracted substantially simultaneously to enable bar 28 to be moved.

Locator pin 40 has a shank 102 set in sleeve end wall 52. Shank 102 projects outwardly beyond sleeve 42 for receipt in slot 72 and engagement with the edges of narrow portion 84 to guide latch bolt 38 into proper location to be received in aperture 70. At the free end of pin 40 is a buttonhead 104 of greater diameter than the width of narrow portion 84 of slot 72 for internally engaging striker plate 44 when bar 28 is latched to prevent bar 28 from pulling away from plate 44 and frame 24 along a direction generally parallel to the longitudinal axis of bar 28. As is shown more clearly in FIG. 3, when bar 28 is latched, pin 40 can bear against the end of slot 72 to prevent bar 28 from pivoting toward panels 22.

Referring to FIG. 2, swing arm 32 is fixedly mounted at one end generally perpendicularly to bottom wall 48 of sleeve 42 and pivotally mounted at the opposite end to frame 24 on a cantilevered pivot 106 attached to a mounting bracket 108 affixed to frame 24. Arm 32 is an elongated tubular beam of generally rectangular cross section, and has a gusset 110 angularly oriented between arm 32 and sleeve 42 to reinforce and rigidify the attachment between arm 32 and sleeve 42. Arm 32 is of sufficient length to provide adequate clearance between bar 28 and panels 22 when bar 28 has been swung from the latched position shown in FIG. 1 downwardly away from the top edges of panels 22 permitting panels 22 to be loaded onto or removed from bed 26. Mounting bracket 108 projects outwardly from frame 24 to adjacent an end of arm 32 and has a wall 112 at its free end with an opening 114 therein for receiving pivot 106. Pivot 106 extends from bracket 108 through a pair of coaxial openings 116,118 in swing arm 32 to secure arm 32 to frame 24 and prevent disengagement of bar 28 from frame 24.

Pivot 106 includes a bolt 120 having a head 122, a shank 124, a threaded end 126, a shoulder 128 between shank 124 and end 126, and a nut 130 to secure bolt 120 to mounting bracket 108. Bolt 120 coaxially extends through swing arm openings 116,118, with its threaded end 126 received in mounting bracket opening 114 and nut 130 threadably secured on bolt end 126 drawing shoulder 128 firmly against outer bracket wall 112 securing bolt 120 to bracket 108 and rotatively supporting swing arm 32. When bolt 120 is so secured to bracket 108, arm 32 rides on shank 124 permitting bar 28 to rotate about an axis of bolt 120. Preferably, a pair of friction washers 132,134 are received on shank 124 of bolt 120 on either side of swing arm 32 for facilitating relative rotational movement between arm 32 and bracket 108. A washer 136 on threaded end 126 of bolt 120 is disposed between nut 130 and the inner surface of bracket wall 112 better to secure bolt 120 to bracket 108.

In use, bar 28 may be manually swung upwardly around the common axis of both pivots 106 (FIG. 1) until cam face 86 of latch bolt 38 engages front wall 78 of striker plate 44 and shank 102 of locator pin 40 enters mouth 82 of slot 72. As bar 28 is further pivoted upwardly toward the top edges of panels 22, bolt 38 is urged by front wall 78 to retract into guideway 54 against spring 88, and pin 40 enters narrow portion 84 of slot 72 guiding bolt 38 toward aperture 70 in striker plate 44. When bar 28 is pivoted to the position shown in FIG. 1, coil spring 88 snaps bolt 38 outwardly into aperture 70 latching bar 28 in position to retain panels 22 for shipment. When bar 28 is latched in this position, bolt 38 can engage striker plate 44 to prevent bar 28 from moving away from the top edges of panels 22 while pin 40, positioned adjacent the end of slot 72, can internally abut the end of slot 72 to prevent bar 28 from moving further toward panels 22.

To unlatch bar 28, cable 98 is grasped and pulled in a direction generally perpendicular to the longitudinal axis of bar 28, thereby substantially simultaneously withdrawing latch bolts 38 at both ends of bar 28 from their associated apertures 70 by retracting bolts 38 into their associated guideways 54. Bar 28 may then be freely pivoted downwardly, away from the top edges of panels 22 to a position disposed from the latched position to load or remove panels 22.

The invention claimed is:

1. A bar and bar lock arrangement comprising:
a bar having spaced ends,
means at each end of said bar for releasably securing each end of said bar to a frame,
a pair of swing arms respectively extending from each end of said bar, each said swing arm having a first end affixed to said bar and a second end spaced from said bar, and means on each said swing arm for pivotally mounting said second end of said swing arm to the frame, so that said swing arms and said bar are pivotable as a unit with respect to the frame about an axis parallel to said bar and defined by said pivotally mounting means.

2. The arrangement set forth in claim 1 wherein said releasably securing means at each end of said bar comprises:
striker means positioned on the frame opposite each end of said bar, and
means on each end of said bar for releasably latching said bar to said striker means in a latched position of said bar.

3. The arrangement set forth in claim 2 wherein said releasably latching means on each end of said bar comprises: a latch bolt projecting from said bar and an aperture in said striker means for receiving said latch bolt releasably to latch said bolt to said striker means in said latched position to prevent said bar from moving relative to said striker means in a direction generally orthogonal to a longitudinal axis of said bar.

4. The arrangement set forth in claim 3 wherein said releasably securing means at each end of said bar further comprises a pin projecting from said bar and a slot in said striker means for receiving said pin to guide said bar into said latched position and locating said latch bolt to be received in said aperture releasably to latch said bar to said striker means.

5. A bar and bar lock arrangement comprising a bar having spaced ends, means at each end of said bar for releasably securing each end of said bar to a frame, a pair of swing arms respectively extending from each end of said bar, and means on each said swing arm for pivotally mounting said swing arm and said bar to the frame, said releasably securing means at each end of said bar comprising striker means for positioning on the frame opposite an end of said bar and means on each end of said bar for releasably latching said bar to said striker means in a latched position of said bar,
said releasably latching means on each end of said bar comprising a latch bolt projecting from said bar, an aperture in said striker means for receiving said latch bolt releasably to latch said bolt to said striker means in said latched position to prevent said bar from moving relative to said striker means in a direction generally orthogonal to a longitudinal axis of said bar, a pin projecting from said bar and a slot in said striker means for receiving said pin to guide said bar into said latched position and locating said latch bolt to be received in said aperture releasably to latch said bar to said striker means.

6. The arrangement set forth in claim 3 wherein said releasably latching means at each end of said bar also comprises:
a guideway on said bar generally parallel with a longitudinal axis of said bar for receiving said latch bolt therein, and
means resiliently urging said latch bolt outwardly for receipt in said aperture.

7. A bar and bar lock arrangement comprising a bar having spaced ends, means at each end of said bar for releasably securing each end of said bar to a frame, a pair of swing arms respectively extending from each end of said bar, and means on each said swing arm for pivotally mounting said swing arm and said bar to the frame, said releasably securing means at each end of said bar comprising striker means for positioning on the frame opposite an end of said bar and means on each end of said bar for releasably latching said bar to said striker means in a latched position of said bar,
said releasably latching means on each end of said bar comprising a latch bolt projecting from said bar, an aperture in said striker means for receiving said latch bolt releasably to latch said bolt to said striker means in said latched position to prevent said bar from moving relative to said striker means in a direction generally orthogonal to a longitudinal axis of said bar, a guideway on said bar generally parallel with a longitudinal axis of said bar for receiving said latch bolt therein, and means resiliently urging said latch bolt outwardly for receipt in said aperture.

8. The arrangement set forth in claim 7 wherein each said latch bolt and each said striker means have opposed cam means for urging said latch bolt against said resiliently urging means as said bar is moved to said latched position.

9. The arrangement set forth in claim 8 wherein said cam means on each said latch bolt comprises an angled end face on said bolt.

10. The arrangement set forth in claim 3 also comprising cable means connecting said latch bolts to each other for substantially simultaneous retraction of said latch bolts from the corresponding said striker means.

11. The arrangement set forth in claim 2 wherein said releasably securing means at each end of said bar further comprises a pin projecting from said bar and a slot in said striker means for receiving said pin to guide said bar into said latched position and enabling said releasably latching means to latch said bar to said striker means.

12. The arrangement set forth in claim 11 wherein each said pin has a shank for receipt in the corresponding said slot for guiding said bar into said latched position and an enlarged head at one end of said shank remote from said bar for engaging said striker means when said bar is in said latched position to prevent said bar from pulling away from said striker means in a direction generally parallel to a longitudinal axis of said bar.

13. The arrangement set forth in claim 1 wherein each said swing arm comprises an elongated beam of fixed length.

14. The arrangement of claim 1 wherein said pivotally mounting means on each said swing arm comprises axle means constructed to be cantilevered from the frame adjacent to said swing arm for engaging said swing arm pivotally to mount said swing arm to the frame.

15. The arrangement of claim 1 wherein each of said pivotally mounting means comprises:
 a mounting bracket disposed on the frame adjacent a said swing arm and having an opening for receiving a threaded end of a bolt therein,
 a through-opening in said swing arm generally coaxial with said bracket opening and for receiving a shank of a bolt therethrough,
 a bolt having a shank, a threaded end and a shoulder between said shank and said threaded end, said shoulder being received in said swing arm through-opening with said threaded end received in said bracket opening and said bolt shoulder abutting said bracket to enable said swing arm to rotate on said shank about an axis of said bolt, and
 a nut threadably received on said threaded end of said bolt for drawing said bolt shoulder against said bracket to support said bolt and for securing said bolt to said bracket.

16. The arrangement of claim 1 wherein said pivotally mounting means on each said swing arm permits said bar to be moved relative to the frame between said latched position for retaining freight and a position disposed from said latched position to provide sufficient clearance to remove or load freight.

17. A dunnage bar and bar lock arrangement comprising:
 a bar for supporting and retaining freight and having spaced ends,
 a pair of swing arms respectively extending from each end of said bar,
 means on each said swing arm for pivotally mounting said swing arm to a frame and permitting said bar to be pivoted relative to the frame as a unit with said swing arms about an axis spaced from and parallel to said bar and defined by said pivotally mounting means between a position for retaining freight and a position disposed from said freight retaining position to provide sufficient clearance for unloading freight,
 striker means mounted on the frame opposite an end of said bar and including a slot and an aperture,
 means projecting from each end of said bar to engage said slot for locating said bar in said freight retaining position, and
 means projecting from each end of said bar to be received in said aperture for releasably latching said bar to the frame in said freight retaining position.

18. The arrangement set forth in claim 17 wherein said locating means at each end of said bar comprises a pin projecting from said bar and having a shank for receipt in said slot to locate said bar in said freight retaining position.

19. The arrangement set forth in claim 18 wherein said locating means at each end of said bar also comprises an enlarged head at an end of said shank for engaging said striker means when said bar is located in said freight retaining position to prevent said bar from pulling away from the frame in a direction generally parallel to a longitudinal axis of said bar.

20. The arrangement set forth in claim 17 wherein said releasably latching means at each end of said bar comprises:
 a guideway on said bar parallel to a longitudinal axis of said bar,
 a latch bolt slidably telescopically received in said guideway, and
 means resiliently urging said bolt outwardly for being received in said aperture to prevent said bar from moving relative to the frame in a direction generally orthogonal to a longitudinal axis of said bar when said bar is located in said freight retaining position.

21. The arrangement of claim 17 wherein each of said pivotally mounting means comprises:
 a mounting bracket disposed on the frame adjacent a said swing arm and having an opening for receiving a threaded end of a bolt therein,
 a through-opening in said swing arm generally coaxial with said bracket opening and for receiving a shank of a bolt therethrough,
 a bolt having a shank, a threaded end and a shoulder between said shank and said threaded end, said shoulder being received in said swing arm through-opening with said threaded end received in said bracket opening and said bolt shoulder abutting said bracket to enable said swing arm to rotate on said shank about an axis of said bolt, and
 a nut threadably received on said threaded end of said bolt for drawing said bolt shoulder against said bracket to support said bolt and for securing said bolt to said bracket.

22. A bar and bar lock arrangement comprising:
 a bar having spaced ends,
 a striker plate opposite each end of said bar and having a slot and an aperture therein,
 a pin projecting from each end of said bar having a shank for receipt in said slot to locate said bar in a predetermined position and an enlarged head at an end of said shank for engaging said striker plate when said pin is located in said slot to prevent said bar from pulling away from said plate in a direction along a longitudinal axis of said bar,
 a latch bolt projecting from each end of said bar for being received in said apertures when said pins are located in said slots releasably to secure said bar to each said striker plate to prevent said bar from moving relative to each said striker plate in a direction generally orthogonal to a longitudinal axis of said bar, and
 a pair of arms projecting from respective spaced ends of said bar for pivotally mounting said bar to swing as a unit with said arms in an arc orthogonal to the longitudinal axis of said bar.

23. The arrangement set forth in claim 5 wherein each said pin has a shank for receipt in the corresponding said slot for guiding said bar into said latched position and an enlarged head at an end of said shank remote from said bar for engaging said striker means when said bar is in said latched position to prevent said bar from pulling away from said striker means in a direction generally parallel to the longitudinal axis of said bar.

24. The arrangement set forth in claim 7 wherein each said resiliently urging means comprises a coil spring captured in compression within said guideway and in engagement with an end of said latch bolt.

25. A bar and bar lock arrangement comprising a bar having spaced ends,
    means at each end of said bar for releasably securing each end of said bar to a frame,
    a pair of swing arms respectively extending from each end of said bar, and means on each said swing arm for pivotally mounting said swing arm and said bar to the frame,
    said releasably securing means at each end of said bar comprising striker means for positioning on the frame opposite an end of said bar and means on each end of said bar for releasably latching said bar to said striker means in a latched position of said bar,
    said releasably latching means on each end of said bar comprising a latch bolt projecting from said bar, an aperture in said striker means for receiving said latch bolt releasably to latch said bolt to said striker means in said latched position to prevent said bar from moving relative to said striker means in a direction generally orthogonal to a longitudinal axis of said bar, and cable means connecting said latch bolts to each other for substantially simultaneous retraction of said latch bolts from the corresponding said striker means.

26. A dunnage bar and bar lock arrangement comprising:
    a bar for supporting and retaining freight, said bar having spaced ends,
    a pair of swing arms respectively extending from each end of said bar,
    means on each said swing arm for pivotally mounting said swing arm and said bar to a frame and permitting said bar to be pivoted by said swing arms relative to the frame between a position for retaining freight and a position disposed from said freight retaining position to provide sufficient clearance for unloading freight,
    striker means mounted on the frame opposite each end of said bar and including a slot and an aperture,
    means projecting from each end of said bar to engage said slot for locating said bar in said freight retaining position, and
    means projecting from each end of said bar to be received in said aperture for releasably latching said bar to the frame in said freight retaining position, including
    a guideway on said bar parallel to a longitudinal axis of said bar,
    a latch bolt slidably telescopically received in said guideway, and
    means resiliently urging said bolt outwardly for being received in said aperture to prevent said bar from moving relative to the frame in a direction generally orthogonal to a longitudinal axis of said bar when said bar is located in said freight retaining position.

27. The arrangement set forth in claim 26 further comprising cable means connecting said latch bolts to each other for substantially simultaneous retraction of said latch bolts from the corresponding said striker means.

* * * * *